(12) United States Patent
Kim et al.

(10) Patent No.: US 10,299,375 B2
(45) Date of Patent: May 21, 2019

(54) FLEXIBLE CIRCUIT BOARD HAVING ENHANCED BENDING DURABILITY

(71) Applicant: GigaLane Co., Ltd., Hwaseong-si (KR)

(72) Inventors: Sang Pil Kim, Hwaseong-si (KR); Da Yeon Lee, Hwaseong-si (KR); Hwang Sub Koo, Hwaseong-si (KR); Hyun Je Kim, Hwaseong-si (KR); Hee Seok Jung, Hwaseong-si (KR)

(73) Assignee: GigaLane Co., Ltd., Hwaseong-si, Gyeonggi-Do (KR)

( * ) Notice: Subject to any disclaimer, the term of this patent is extended or adjusted under 35 U.S.C. 154(b) by 0 days.

(21) Appl. No.: 15/923,017

(22) Filed: Mar. 16, 2018

(65) Prior Publication Data

US 2018/0206331 A1    Jul. 19, 2018

Related U.S. Application Data

(63) Continuation of application No. PCT/KR2016/007477, filed on Jul. 11, 2016.

(30) Foreign Application Priority Data

Sep. 24, 2015  (KR) .................. 10-2015-0135385

(51) Int. Cl.
  *H05K 1/02* (2006.01)
  *H05K 1/09* (2006.01)
  (Continued)

(52) U.S. Cl.
  CPC ............. *H05K 1/028* (2013.01); *H05K 1/024* (2013.01); *H05K 1/0242* (2013.01); *H05K 1/09* (2013.01); *H05K 1/115* (2013.01); *H05K 3/4691* (2013.01); *H05K 1/0225* (2013.01);
  *H05K 1/0251* (2013.01); *H05K 3/0026* (2013.01); *H05K 3/0044* (2013.01); *H05K 3/28* (2013.01);
  (Continued)

(58) Field of Classification Search
  CPC .... H05K 1/0277; H05K 1/0278; H05K 1/028; H05K 1/0281; H05K 1/0283
  See application file for complete search history.

(56) References Cited

U.S. PATENT DOCUMENTS 4,931,134 A * 6/1990 Hatkevitz ............ H05K 3/0035
                                                            156/150
5,024,896 A   6/1991 Mathad
                        (Continued)

FOREIGN PATENT DOCUMENTS

JP      2002-093526     3/2002
WO      96-38026        11/1996

OTHER PUBLICATIONS

WIPO, a Written Opinion of PCT/KR2016/007477 dated Oct. 19, 2016.

*Primary Examiner* — Jeremy C Norris
(74) *Attorney, Agent, or Firm* — Brundidge & Stanger, P.C.

(57) ABSTRACT

The present invention provides a flexible circuit board having enhanced bending durability. The flexible circuit board comprises: a first board part; a second board part which extends from one side of the first board part and is thinner than the first board part so as to be bendable; and a third board part which extends from one side of the second board part and is thinner than the second board part so as to be bendable.

16 Claims, 6 Drawing Sheets

(51) Int. Cl.
*H05K 1/11* (2006.01)
*H05K 3/46* (2006.01)
*H05K 3/00* (2006.01)
*H05K 3/28* (2006.01)

(52) U.S. Cl.
CPC .............. *H05K 2201/093* (2013.01); *H05K 2201/0969* (2013.01); *H05K 2201/09236* (2013.01); *H05K 2201/09618* (2013.01); *H05K 2201/09672* (2013.01); *H05K 2203/0228* (2013.01); *H05K 2203/107* (2013.01)

(56) References Cited

U.S. PATENT DOCUMENTS

| | | |
|---|---|---|
| 5,262,594 A | 11/1993 | Edwin |
| 5,499,444 A | 3/1996 | Doane, Jr. |
| 2011/0198111 A1* | 8/2011 | Naganuma ........... H05K 3/4691 174/254 |

* cited by examiner

FLEXIBLE CIRCUIT BOARD HAVING ENHANCED BENDING DURABILITY

CROSS-REFERENCES TO RELATED APPLICATION

This application is a Continuation Application of PCT Patent Application No. application of PCT/KR2016/007477 filed on Jul. 11, 2016, which claims priority to Korean Patent Application No. 10-2015-0135385 filed on Sep. 24, 2015, the contents of which are incorporated herein by reference.

TECHNICAL FIELD

The invention related to flexible circuit board having enhanced bending durability.

BACKGROUND

Wireless terminal such as mobile phone comprises RF (Radio Frequency) a signal line. The RF signal line is normally made of coaxial cable. Such RF signal line made of coaxial cable makes an inner space of the wireless terminal narrower so that a flexible circuit board generally applied to the wireless terminal nowadays.

However, traditional flexible circuit board is apt to be fractured or broken down in the part of bending such as folding type wireless terminal.

The flexible circuit board makes sure of the necessary amount of signals by decreasing line loss at signal transmission through thickening the signal line or increasing the size of signal line, and by decreasing the signal loss of reflection through shielding the external signals from outside.

The flexible circuit board has optimum impedance of about 33Ω at the signal transmitter, and optimum impedance of about 75Ω at the signal receiver. Considering both the transmitter and receiver, it is ordinary that the flexible circuit board should be designed to have characteristic impedance of about 50Ω.

In the case that external signals are introduced from the other components, the characteristic impedance would be deviated from the normal level of 50Ω, so that the signal transmission efficiency might be aggravated. Particularly, when any components such as a main board, a sub-board, and a battery are brought into contact with or disposed close to the ground, the characteristic impedance of the flexible circuit board deviates from about 50Ω thereof.

Therefore, the flexible circuit board should be applied at the reasonably separated location from other components so as to prevent unwanted impedance variation. In this case, however, the inner space of the terminal, which is the main merit and advantage of flexible circuit board, may be narrower.

The flexible circuit board may be placed near other components by the impedance matching. However, in this case, the shape of flexible circuit board should be changed as well, according to the variation of shape or location of at least one component among its main board, sub board, battery or so. Therefore, it is necessary that the flexible circuit board can be installed freely inside of the wireless terminal without effect of other components therein.

The background described herein will be understood only for the purposes of understanding of background of the invention, so that said background should not be accepted the prior art of the invention in the view of the person having ordinary skilled in the art.

DETAILED DESCRIPTION OF THE INVENTION

Technical Problems

The invention may provide the enhanced bending durable flexible circuit board, which can be installed in the terminal without locational limit, enhance the bending durability, and prevent some damages of the signal line and ground line thereof.

SUMMARY OF THE INVENTION

In one embodiment, the invention of enhanced bending durable flexible circuit board having enhanced bending durability comprises, (1) a first substrate part, (2) a second substrate part extending from one side of the first substrate part and thinner than the first substrate part to be able to bend, and (3) a third substrate part extending from one side of the second substrate part and thinner than the second substrate part to be able to bend.

In one embodiment, the first substrate part comprises, (1) a first dielectric, (2) a second dielectric facing the upper surface of the first dielectric, (3) a third dielectric facing the bottom surface of the second dielectric, (4) a first ground layer stacked on the first dielectric, (5) a second ground layer stacked on the bottom surface of the first dielectric, (6) a third ground layer stacked on the second dielectric, (7) a fourth ground layer stacked on the bottom surface of the third dielectric, (8) a via hole penetrating from the first dielectric to the third dielectric and the first ground layer to the fourth ground layer so that the first ground layer to the fourth ground layer can be electrically connected to each other.

In one embodiment, the second substrate part may exclude at least one of the third ground layer and the fourth ground layer which are included in the first substrate part.

In one embodiment, the third substrate part may exclude at least two layers selected from the group of the second dielectric, the third dielectric, the third ground layer, and the fourth ground layer which are included in the first substrate part.

In one embodiment, the first ground layer and the second dielectric are coupled via a first bonding sheet, the second ground layer and the third dielectric are coupled via a second bonding sheet, and the via hole is formed in the first bonding sheet and the second bonding sheet.

In one embodiment, the signal line is formed on the first dielectric, the first bonding sheet is, in a pair, positioned and spaced apart from each other by a predetermined distance with the signal line therebetween, and provides an inner space partitioned by the first dielectric, the second dielectric and the first bonding sheet. Preferably, the signal line is located in the inner space.

In one embodiment, the gap between the second ground layer and the fourth ground layer may be greater than the gap between the first ground layer and the third ground layer.

In one embodiment, the third ground layer is formed with a plurality of ground holes spaced apart from each other by a predetermined distance.

In one embodiment, the third substrate part may comprise, (1) the first dielectric, (2) the signal line stacked on the first dielectric, (3) a pair of the first ground layers stacked on the first dielectric and spaced apart from each other by a predetermined distance with the signal line therebetween, (4) a pair of the second ground layers stacked on the first dielectric bottom surface and spaced apart from each other by a predetermined distance. In this case, the signal line may include a first signal line and a pair of second signal lines branched from the first signal line and positioned parallel to each other.

In one embodiment, the third substrate part may comprise, (1) the first dielectric, (2) the signal line stacked on the first dielectric, (3) a pair of the second ground layers stacked on the first dielectric bottom surface and spaced apart from each other by a predetermined distance. In this case, the signal line may include a first signal line and a pair of second signal lines branched from the first signal line and positioned in parallel with each other.

In one embodiment, the third substrate part comprises, (1) the first dielectric, (2) the signal line stacked on the first dielectric, (3) a pair of the first ground layers stacked on the first dielectric and spaced apart from each other by a predetermined distance with the signal line therebetween. In this case, the signal line includes a first signal line and a pair of second signal lines branched from the first signal line and positioned parallel to each other.

In one embodiment, the gap between the second signal lines and the first ground layer may be smaller than the gap between the first signal line and the first ground layer.

In one embodiment, the third substrate part may comprise, (1) the first dielectric, (2) the signal line stacked on the first dielectric, (3) a pair of the first ground layers stacked on the first dielectric and spaced apart from each other by a predetermined distance with the signal line therebetween, (4) the second ground layer formed on the first dielectric bottom surface. In this case, the second ground layer may comprise (1) a pair of line grounds stacked at a predetermined gap with the signal line therebetween, and (2) a mesh ground connecting a pair of the line grounds.

In one embodiment, the third substrate part may comprise, (1) the first dielectric, (2) the signal line stacked on the first dielectric, (3) a pair of the first ground layers stacked on the first dielectric, the first ground layer being spaced apart from each other by a predetermined distance with the signal line therebetween, (4) the second ground layer stacked on the bottom surface of the first dielectric. In this case, the second ground layers may be made of silver paste.

The details of embodiments of the invention are set forth in the accompanying drawings and the description below.

The terms and words used in this specifications and claims should not be interpreted by the means of ordinary, plain and dictionary meaning, instead that the terms and words herein should be interpreted according to the technical idea of the invention, by the principle of lexicographer.

THE EFFECTS OF THE INVENTION

The invention may have various effects as bellows;

Firstly, flexible circuit board may be placed anywhere inside the wireless terminal.

Secondly, the flexible circuit board may be much more bending durable.

Thirdly, the damages of signal line and ground may be prevented in the manufacturing process of the flexible circuit board.

DESCRIPTION OF MARK

100: first substrate part 200: second substrate part
300: third substrate part 400: first ground layer
500: second ground layer 510: line ground
520: mesh ground 600: third ground layer
700: fourth ground layer 800: signal line
810: first signal line 920: second signal line
B1: first bonding sheet B2: second bonding sheet
C1: first protective sheet C2: second protective sheet
E1: first dielectric E2: second dielectric
E3: third dielectric H: inner space forming groove
GH: ground hole VH: via hole

DETAILED DESCRIPTION

The objects, specific advantages and novel features of the invention will become more apparent from the following detailed description and embodiments accompanying drawings. It should be noted that the reference numerals are added to the elements of the drawings in the specifications with the same numerals as possible, even if they are on other drawings. Also, the terms "first", "second", etc. may be used to describe various elements, but the elements should not be limited by the terms. The terms are used only for the purpose of distinguishing one element from another. In the following description of the invention, a detailed description of publicly-known related arts will be omitted when it is determined that the spirit or gist of the invention may be unnecessarily obscured.

Hereinafter, the embodiments of the invention will be described in detail with reference to the accompanying drawings.

The flexible circuit board having improved bending durability according to an embodiment of the invention prevents impedance from being changed due to influence of other components such as a main board, a sub-board, or a battery, and prevents transmission lines at continual bending portion from being damaged. In addition, there is an advantage that the signal line and the ground can be prevented from being damaged in the manufacturing process.

Figure 1:
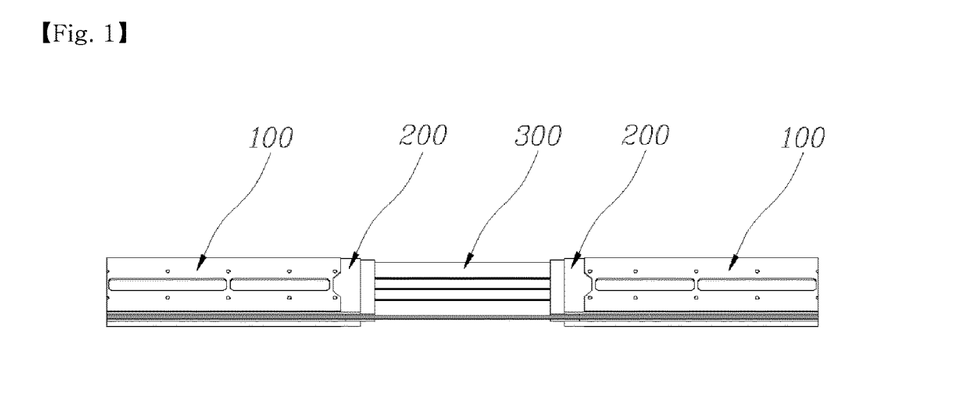
FIG. 1 is a schematic view of flexible circuit board with enhanced bending durability.
Figure 2:
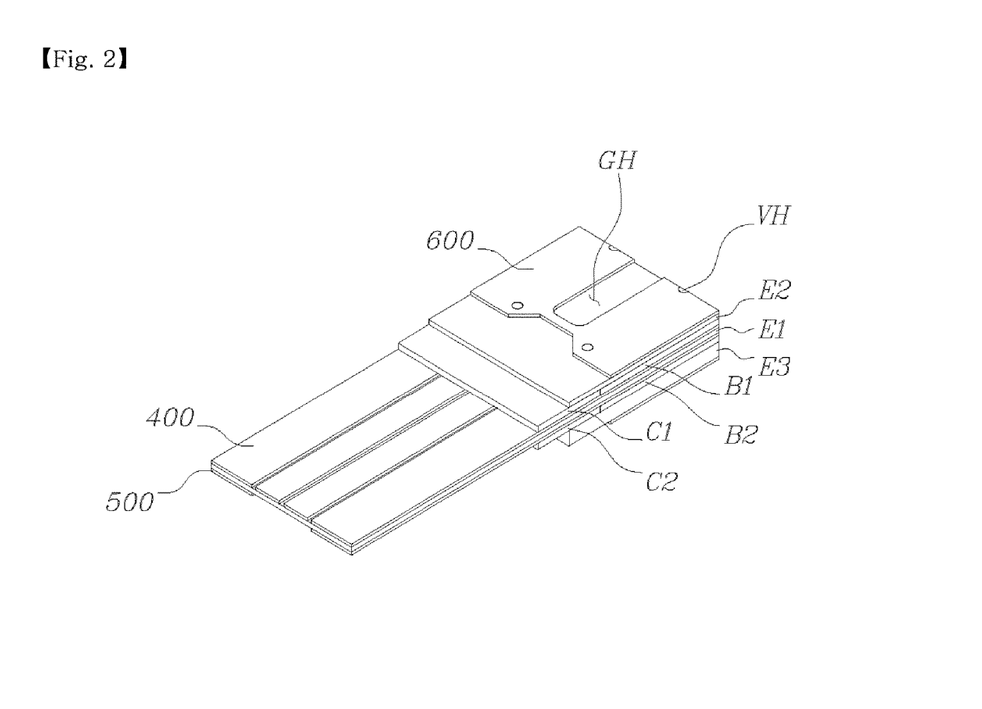
FIG. 2 is a perspective view of a part of flexible circuit board from FIG. 4.
Figure 3:
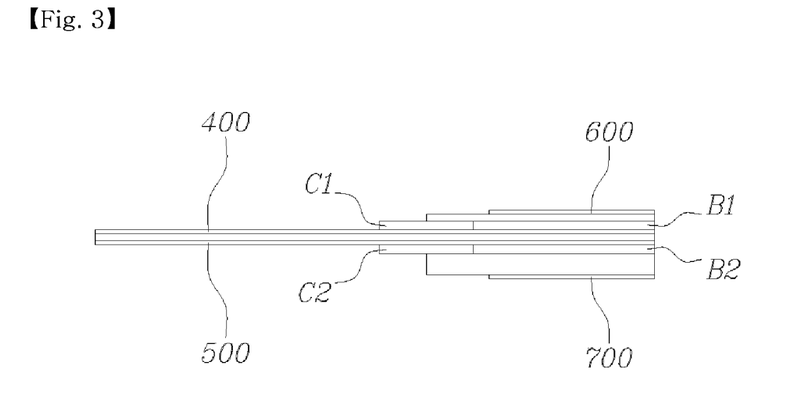
FIG. 3 is a side view of flexible circuit board in FIG. 5.

According to FIGS. 1 to 3, one embodiment of the flexible circuit board having enhanced bending durability may include a first substrate part 100, a second substrate part 200, and a third substrate part (300).

The thicknesses of the first substrate part 100, the second substrate part 200, and the third substrate part 300 are sequentially decreased.

The second substrate part 200 is formed to extend from one end of the first substrate part 100, and is formed to be thinner than the first substrate part 100. The third substrate part 300 is formed to extend from one end of the second substrate part 200 to be thinner than the second substrate part 200.

The third substrate part 300 may be a section where bending occurs repeatedly in the wireless terminal. When the third substrate part 300 is directly extended from the first substrate part 100, stress is concentrated to the connection between the first substrate part 100 and the third substrate part 300, so that the connection is apt to be broke. Accordingly, the inventors introduce "sequential thickness variation" to this embodiment. That is, the "sequential thickness variation" is the connection between the first substrate part 100 and the second substrate part 200 via the second substrate part 200, which is thinner than the first substrate part 100 and thicker than the third substrate part 300.

Figure 4:
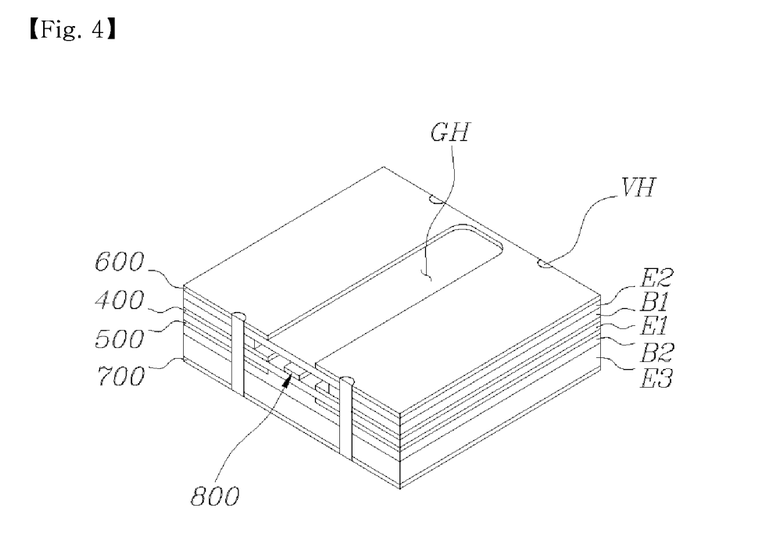
FIG. 4 is a perspective view of flexible circuit board.
Figure 5:
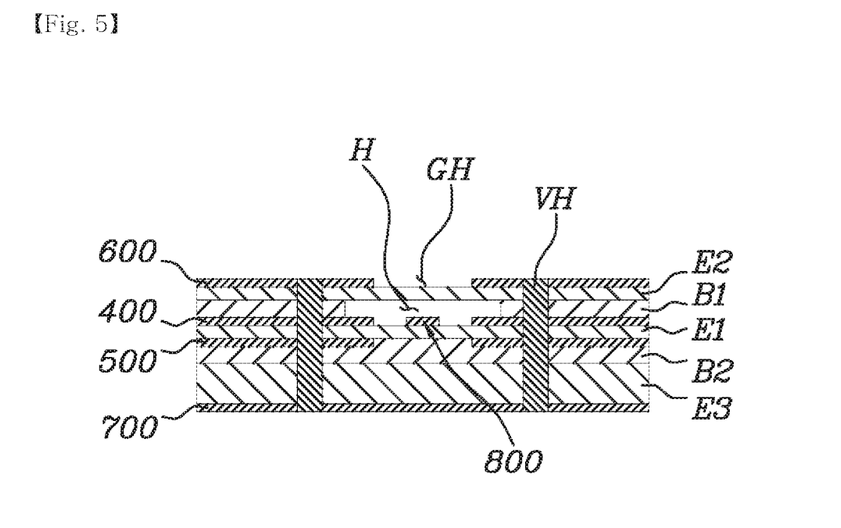
FIG. 5 is a cross-sectional view of flexible circuit board.

As shown in FIGS. 4 and 5, the first substrate part 100 of the flexible circuit board with enhanced bending durability according to an embodiment of the invention, may include a first dielectric E1, a second dielectric body E2, a third dielectric E3, a first ground layer 400, a second ground layer 500, a third ground layer 600, a fourth ground layer 700, and a via hole VH. That is, the first substrate part 100 may have a three-layered dielectric structure and a four-layered ground layer structure.

The three-layer dielectric structure comprises the first dielectric E1, the second dielectric E2, and the third dielectric E3. The second dielectric E2 is located parallel apart from the upper surface of the first dielectric E1, and the third dielectric E3 is placed parallel apart from the bottom surface of the first dielectric E1.

The four-layered ground layer structure comprises the first ground layer 400 formed on the first dielectric E1, the second ground layer 500 formed on the bottom surface of the first dielectric E1, the third ground layer 600 on the second dielectric E2, and the fourth ground layer 700 on the bottom surface of the third dielectric E3.

On the other hand, the first ground layer 400 and the bottom surface of the second dielectric E2 are bonded to each other through the first bonding sheet B1, while the second ground layer 500 and the surface of the third dielectric E3 are bonded by a bonding sheet B2.

Also, the flexible circuit board having improved bending durability according to an embodiment of the invention may include a via hole VH filled with a conductor material. The via hole VH filled with a conductor in a hole passing through the first dielectric E1 to the third dielectric E3, and the first ground layer 400 to the fourth ground layer 700, and the first bonding sheet B1 and the second bonding sheet B2, in order to enable to be conductive and connected electrically.

A signal line 800 is disposed on the first dielectric E1, and a pair of the first bonding sheet B1 are spaced apart from each other with the signal line 800 therebetween, so that the inner space formed by the second dielectric E2 and the first bonding sheet B1. Accordingly, it is preferable that the signal line 800 is located in the inner space. That is, since the signal line 800 is located in the inner space and exposed to the air having a low dielectric constant ($\varepsilon=1.0005$), the flexible circuit board with improved bending durability according to an embodiment of the invention can reduce the line loss in the signal line 800. As described above, the shape of the first bonding sheet B1 is preferably a shape to prevent outer material from introducing through its both ends.

As shown in FIG. 1 and FIG. 2, it is preferable that a plurality of ground holes GH is formed at a regular gap from each other in the third ground layer 600. The gap between the second ground layer 500 and the fourth ground layer 700 is preferably larger than the gap between the first ground layer 400 and the third ground layer 600.

The flexible circuit board having improved bending durability according to an embodiment of the invention may prevent an external signal from being introduced using the fourth ground layer 700. Also, it is possible to satisfy the characteristic impedance of the signal line 800 adjusted to about 50Ω by using the fourth ground layer 700 and the third ground layer 600 having the plurality of ground holes GH, as well as to reduce the line loss and thickness thereof.

As shown in FIGS. 4 and 5, the gap between the second ground layer 500 and the fourth ground layer 700 and the gap between the first ground layer 400 and the third ground layer 600 may be controllable by adjusting the thickness of the second dielectric E2 and the third dielectric E3. In this case, the thickness of the third dielectric E3 is preferably 1.5 times or more that of the second dielectric E2.

Provided that the thickness of the third dielectric E3 is increased, the signal line 800 can be formed thicker and the line loss can be reduced.

In addition, when the ground hole GH is formed in the third ground layer 600, the second dielectric E2 can be made thinner, and the thickness of the flexible circuit board can be reduced.

As shown in FIG. 2 and FIG. 3, the second substrate part 200 of the enhanced bending durable flexible circuit board according to an embodiment of the invention may exclude at least one of the third ground layer 600 and the fourth ground layer 700 of the second substrate part 200.

That is, the second substrate part 200 comprises a first dielectric E1, a second dielectric E2, a third dielectric E3, the first ground layer 400, and the second ground layer 500. The third ground layer 600 and the fourth ground layer 700 are selectively applied or not applied to the second substrate part 200 in order to be thinner than the first substrate part 100.

The third substrate part 300 may be formed thinner than the second substrate part 200 by excluding at least of two selected from the group consisting of the second dielectric E2, the third dielectric E3, the third ground layer 600 and the fourth ground layer 700.

As the first substrate part 100, the second substrate part 200 and the third substrate part 300 are sequentially thinned, it is possible to prevent stress concentration at a specific portion due to a sudden change in thickness, and the enhanced bending durable flexible circuit board according to an embodiment of the invention has an advantage that bending durability is highly improved.

The flexible circuit board with improved bending durability according to an embodiment of the invention may comprise a first protective sheet C1 and a second protective sheet C2. The first protective sheet C1 and the second protective sheet C2 are made of a poly-based resin such as polyimide or epoxy-based resin. The first protective sheet C1 and the second protective sheet C2 are installed between the first E1 and second dielectrics E2, the first E1 and third dielectric E3 respectively, and are connected to or overlap with the first bonding sheet B1 and the second bonding sheet B2 respectively.

The third substrate part 300 may be made by cutting, with blade or laser beam or the like, the second dielectric E2 on the upper surface of the first dielectric E1 and the third dielectric E3 on the bottom surface of the first dielectric E1. In this case, the first protective sheet C1 is introduced between the second dielectric E2 and the first ground layer 400 so as to be connected or overlapped at one end of the first bonding sheet B1, and the other end is formed so as to protrude further than the end of the second dielectric E2 in the direction of the signal line. The second protective sheet C2 is interposed between the third dielectric E3 and the second ground layer 500, and the other end is formed so as to protrude further than the end of the second dielectric E2 in the direction of the signal line. Accordingly, the first protective sheet C1 and the second protective sheet C2 can protect the signal line 800, the first ground layer 400 and the second ground layer 500 from a blade or a laser beam. Therefore, when cutting, the signal line 800, the first ground layer 400 and the second ground layer 500 can be prevented from being damaged as well as unnecessary carbide formation can be prevented.

The first protective sheet C1 is coated with a thermosetting adhesive on its bottom surface so as to be fixed between the second dielectric E2 and the first ground layer 400, and the adhesive may be applied to the upper surface of the first protective sheet C1 except the external exposed surface due to cutting the second dielectric E2. In addition, the first protective sheet C1 may be formed so that the first bonding sheet B1 is extended and overlapped with the first protective sheet C1 instead of applying the thermosetting adhesive.

The second protective sheet C2 is coated with a thermosetting adhesive on the surface and the adhesive may be applied to the surface of the second protective sheet C2 except the external exposed surface due to cutting the third dielectric E3. Also, the second protective sheet C2 may be formed so that the second bonding sheet B2 is extended and overlapped with the second protective sheet C2 without of applying the thermosetting adhesive.

On the other hand, a pair of the first bonding sheet B1 forms the inner space to be defined by installing spaced apart from each other by a regular distance between a pair of the signal lines 800, and the inner space is made by the first dielectric E1, the second dielectric E2, and the first bonding sheet B1. Thereby the first bonding sheet B1 is provided with an inner space forming groove H.

Hereinafter, various embodiments of the third substrate part will be described.

Figure 6:
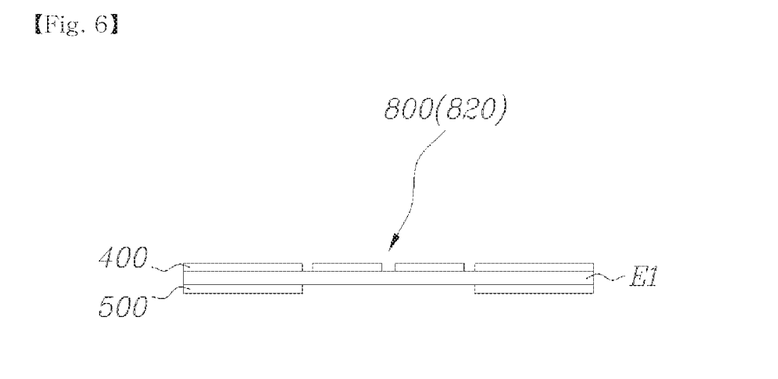
FIG. 6 is a schematic view of the first embodiment of the invention.

FIG. 6 is a view showing a first embodiment of the third substrate part 300 of the invention.

As shown in FIG. 6, the third substrate part 300 may include the first dielectric E1, the signal line 800 stacked on the first dielectric E1, and a pair of the first ground layer 400 stacked on the first dielectric E1 and spaced apart from each other by a regular distance between the signal lines, a pair of the second ground layers 500 stacked on the bottom of the first dielectric E1 and spaced apart from each other by a regular distance.

In this case, the signal lines 800 may include a first signal line 810 and a pair of parallel second signal lines 820 branched from the first signal line 810.

Figure 7:
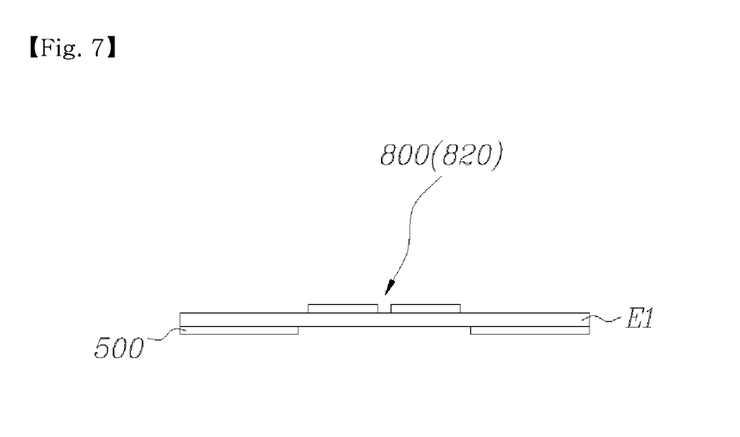
FIG. 7 is a schematic view of the second embodiment of the invention.

FIG. 7 is a view showing a second embodiment of the third substrate part 300 of the invention.

As shown in FIG. 7, the third substrate part 300 may include the first dielectric E1, the signal line 800 stacked on the first dielectric E1, and a pair of the first ground layer 400 stacked on bottom surface of the first dielectric E1 and spaced apart from each other by a regular distance. In this case, the signal lines 800 may include a first signal line 810 and a pair of parallel second signal lines 820 branched from the first signal line 810.

Figure 8:
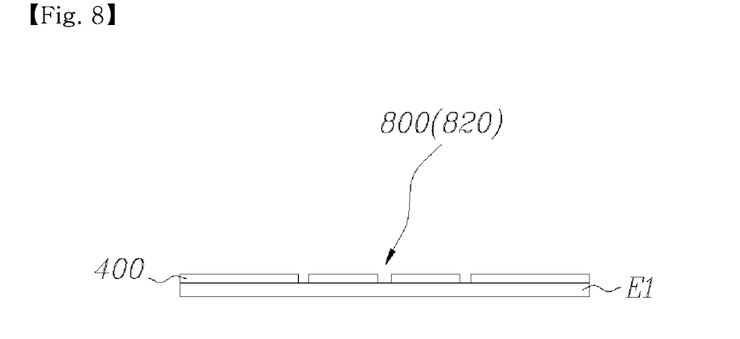
FIG. 8 is a schematic view of the third embodiment of the invention.

FIG. 8 is a view showing a third embodiment of the third substrate part 300 of the invention.

As shown in FIG. 8, the third substrate part 300 may include the first dielectric E1, the signal line 800 stacked on the first dielectric E1, and a pair of the first ground layer 400 stacked on the first dielectric E1 and spaced apart from each other by a regular distance. In this case, the signal lines 800 may include the first signal line 810 and a pair of parallel second signal lines 820 branched from the first signal line 810.

Figure 9:
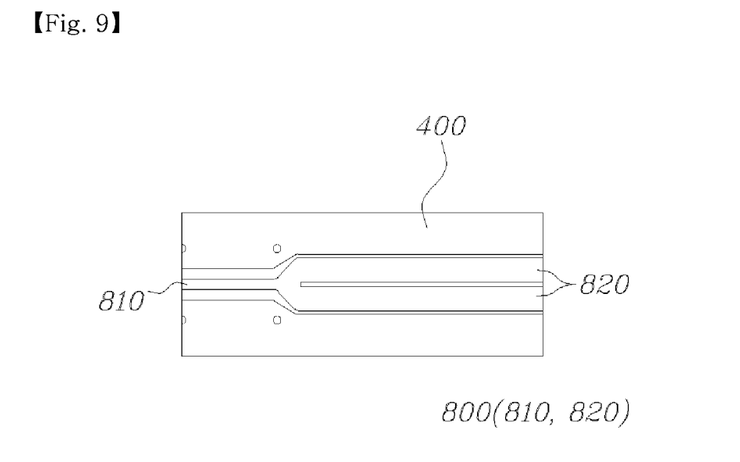
FIG. 9 is a comparative plane view of the first and the third embodiment of the invention.

As shown in FIG. 9, in case of a first and third embodiments of the third substrate part 300 of the invention, the gap between the outer side of the second signal line 820 and inner side of the first ground layer may be thinner than one end of the first signal line 810 and inner side of the first ground layer 400.

Figure 10:
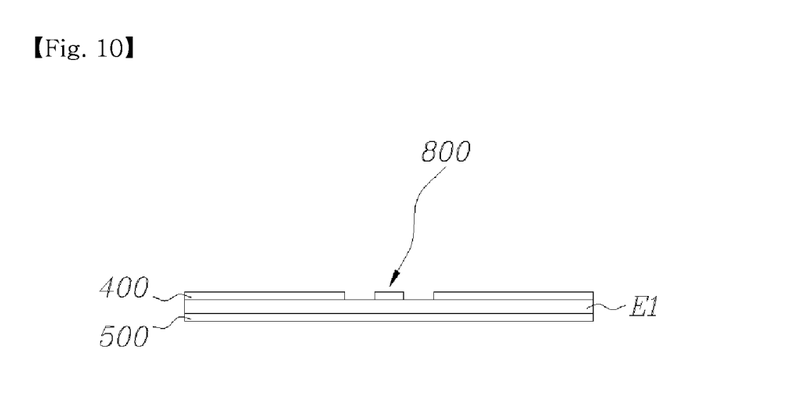
FIG. 10 is a schematic view of the third substrate part in the fourth embodiment and the fifth embodiment.

FIG. 10 is a view showing a fourth and fifth embodiments of the third substrate part 300 of the invention. In addition, FIG. 11 is a view showing the second ground layer 500 of the third substrate part 300 in the fourth embodiment of the invention.

Figure 11:
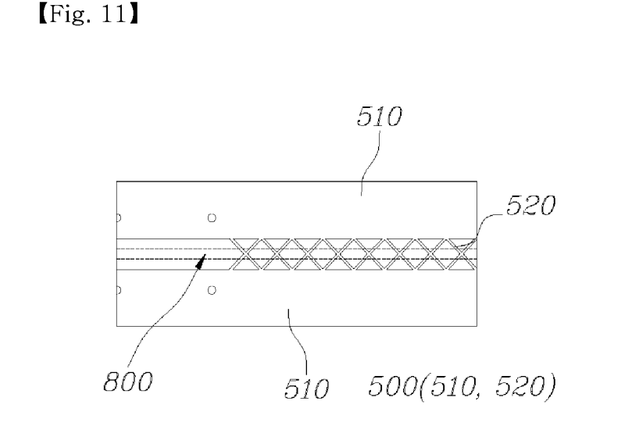
FIG. 11 is a schematic view of the structure of the second ground layer in the fourth embodiment.

As shown in FIG. 10 and FIG. 11, the third substrate part 300 in the fourth embodiment may include the first dielectric E1, the signal line 800 stacked on the first dielectric E1, a pair of the first ground layer 400 stacked on the first dielectric E1 and spaced apart from each other by a regular distance between the signal lines 800, and the second ground layer 500 on the bottom surface of the first dielectric E1. In this case, the second ground layer 500 may include a pair of line ground 510, which is formed apart from each other on the both side of the signal line 800, and the mesh ground 520 to connect with a pair of ground 510.

Meanwhile, in the fifth embodiment of the third substrate part 300 of the invention, the second ground layer 500 may be made of silver paste.

While the present invention has been particularly shown and described with reference to exemplary embodiments thereof, it is to be understood that the invention is not limited to the flexible circuit board according to the invention, and it will be apparent to those skilled in the art that variations and modifications may be made without departing from the scope of the present invention.

It will be understood by a person having an ordinary skill in the art that various changes in form and details may be made therein without departing from the spirit and scope of the invention as defined by the appended claims.

INDUSTRIAL AVAILABILITY

The invention provides a flexible circuit board improved in bending durability without restriction of the install position in a wireless terminal and having improved bending durability that prevents a signal line and ground damages during the manufacturing process, so that the invention may be used industrial field.

What is claimed is:
1. A flexible circuit board having enhanced bending durability, the flexible circuit board comprising:
 a first substrate part;
 a second substrate part extending from one side of the first substrate part and parallel to the first substrate part, wherein the second substrate part is thinner than the first substrate part and bendable; and
 a third substrate part extending from one side of the second substrate part and thinner than the second substrate part, wherein the third substrate part is bendable, and
 wherein the first substrate part comprises:
  a first dielectric,
  a second dielectric facing an upper surface of the first dielectric, a third dielectric facing a bottom surface of the first dielectric,
a first ground layer stacked on the first dielectric,
a second ground layer stacked on the bottom surface of the first dielectric,
a third ground layer stacked on the second dielectric,
a fourth ground layer stacked on a bottom surface of the third dielectric, and
a via hole penetrating from the first dielectric to the third dielectric and the first ground layer to the fourth ground layer so that the first ground layer to the fourth ground layer is electrically connected to each other.

2. The flexible circuit board of claim 1, wherein the second substrate part excludes at least one of the third ground layer and the fourth ground layer which are included in the first substrate part.

3. The flexible circuit board of claim 1, wherein the third substrate part excludes at least two selected from the group of the second dielectric, the third dielectric, the third ground layer, and the fourth ground layer which are included in the first substrate part.

4. The flexible circuit board of claim 2, wherein the third substrate part excludes at least two selected from the group of the second dielectric, the third dielectric, the third ground layer, and the fourth ground layer which are included in the first substrate part.

5. The flexible circuit board of claim 1, wherein the first ground layer and the second dielectric are coupled via a first bonding sheet, the second ground layer and the third dielectric are coupled via a second bonding sheet, and the via hole is formed in the first bonding sheet and the second bonding sheet.

6. The flexible circuit board of claim 5, further comprising:
a signal line provided on the first dielectric,
wherein the first bonding sheet comprises a pair of first bonding sheets that are positioned on the first dielectric and spaced apart from each other by a first predetermined distance with the signal line therebetween, and provides an inner space partitioned by the first dielectric, the second dielectric and the first bonding sheet, and
wherein the signal line is located in the inner space.

7. The flexible circuit board of claim 6, wherein a gap between the second ground layer and the fourth ground layer is greater than a gap between the first ground layer and the third ground layer.

8. The flexible circuit board of claim 7, wherein a plurality of ground holes are formed on the third ground layer and the plurality of ground holes are spaced apart from each other by a second predetermined distance.

9. The flexible circuit board of claim 8,
wherein the first ground layer comprises a pair of first ground layers, and the second ground layer comprises a pair of second ground layers,
wherein the third substrate part comprises:
the first dielectric,
the signal line stacked on the first dielectric,
the pair of the first ground layers stacked on the first dielectric and spaced apart from each other by a third predetermined distance with the signal line therebetween, and
the pair of the second ground layers stacked on the bottom surface of the first dielectric and spaced apart from each other by a fourth predetermined distance, and wherein the signal line includes a first signal line, and a pair of second signal lines branched from the first signal line and positioned parallel to each other.

10. The flexible circuit board of claim 8,
wherein the second ground layer comprises a pair of second ground layers,
wherein the third substrate part comprises:
the first dielectric, the signal line stacked on the first dielectric, and the pair of the second ground layers stacked on the bottom surface of the first dielectric and spaced apart from each other by a fifth predetermined distance, and
wherein the signal line includes a first signal line, and a pair of second signal lines branched from the first signal line and positioned in parallel with each other.

11. The flexible circuit board of claim 8,
wherein the first ground layer comprises a pair of first ground layers,
wherein the third substrate part comprises the first dielectric, the signal line stacked on the first dielectric, and the pair of the first ground layers stacked on the first dielectric and spaced apart from each other by a sixth predetermined distance with the signal line therebetween, and
wherein the signal line includes a first signal line, and a pair of second signal lines branched from the first signal line and positioned parallel to each other.

12. The flexible circuit board of claim 9,
wherein a gap between the pair of second signal lines and the first ground layer is smaller than a gap between the first signal line and the first ground layer.

13. The flexible circuit board of claim 11,
wherein a gap between the pair of second signal lines and the first ground layer is smaller than a gap between the first signal line and the first ground layer.

14. The flexible circuit board of claim 8,
wherein the first ground layer comprises a pair of first ground layers,
wherein the third substrate part comprises:
the first dielectric,
the signal line stacked on the first dielectric,
the pair of the first ground layers stacked on the first dielectric and spaced apart from each other by a seventh predetermined distance with the signal line therebetween, and
the second ground layer formed on the bottom surface of the first dielectric, and
wherein the second ground layer comprises a pair of line grounds stacked at an eighth predetermined distance with the signal line therebetween, and a mesh ground connecting the pair of the line grounds.

15. The flexible circuit board of claim 8,
wherein the first ground layer comprises a pair of first ground layers,
wherein the third substrate part comprises:
the first dielectric,
the signal line stacked on the first dielectric,
the pair of the first ground layers stacked on the first dielectric, and spaced apart from each other by a ninth predetermined distance with the signal line therebetween, and
the second ground layer stacked on the bottom surface of the first dielectric, and
wherein the second ground layer is made of silver paste.

16. The flexible circuit board of claim 1, wherein the first substrate part further comprises a plurality of via holes, wherein respective plurality of via holes penetrate from the first dielectric to the third dielectric and the first ground layer to the fourth ground layer so that the first ground layer to the fourth ground layer is electrically connected to each other.

\* \* \* \* \*